United States Patent
Lin et al.

(10) Patent No.: US 8,656,663 B2
(45) Date of Patent: Feb. 25, 2014

(54) COVER STRUCTURE FOR OUTDOOR CASING

(75) Inventors: Cheng-Chun Lin, Taoyuan Shien (TW); Teng-Chi Chen, Taoyuan Shien (TW); Chih-Chuan Chen, Taoyuan Shien (TW)

(73) Assignee: Delta Electronics, Inc., Taoyuan County (TW)

( * ) Notice: Subject to any disclaimer, the term of this patent is extended or adjusted under 35 U.S.C. 154(b) by 0 days.

(21) Appl. No.: 13/243,647

(22) Filed: Sep. 23, 2011

(65) Prior Publication Data

US 2013/0020329 A1 Jan. 24, 2013

(30) Foreign Application Priority Data

Jul. 19, 2011 (TW) .............................. 100125376 A

(51) Int. Cl.
*E04B 7/00* (2006.01)
*E04H 12/28* (2006.01)

(52) U.S. Cl.
USPC .................... 52/198; 52/23; 52/60; 52/302.1; 52/300; 52/567; 454/367

(58) Field of Classification Search
USPC .............. 52/57, 58, 59, 60, 61, 62, 198, 199, 52/200, 302.1, 300, 94, 95, 96, 97, 566, 52/567, 23, 202; 454/359, 366, 363, 367, 454/361
See application file for complete search history.

(56) References Cited

U.S. PATENT DOCUMENTS

| | | | | |
|---|---|---|---|---|
| 3,461,625 A | * | 8/1969 | Sandow | 52/58 |
| 3,559,691 A | * | 2/1971 | Neumann | 138/92 |
| RE28,870 E | * | 6/1976 | Attaway et al. | 52/300 |
| 4,194,497 A | * | 3/1980 | Gramer et al. | 126/623 |
| 4,662,129 A | * | 5/1987 | Hickman | 52/96 |
| 4,858,406 A | * | 8/1989 | Lane et al. | 52/300 |
| 4,895,066 A | * | 1/1990 | Carnahan | 454/275 |
| 5,189,853 A | * | 3/1993 | Braine et al. | 52/96 |
| 5,207,036 A | * | 5/1993 | Sampson et al. | 52/72 |
| 5,279,090 A | * | 1/1994 | Yamaguchi et al. | 52/506.08 |
| 5,289,662 A | * | 3/1994 | Castle | 52/287.1 |
| 5,318,474 A | * | 6/1994 | Klassen et al. | 454/296 |
| 5,394,663 A | * | 3/1995 | Jackson | 52/199 |
| 6,212,829 B1 | * | 4/2001 | Webb et al. | 52/96 |
| 6,216,408 B1 | * | 4/2001 | Davidson | 52/300 |
| 7,168,209 B2 | * | 1/2007 | Heidler, Jr. | 52/60 |

FOREIGN PATENT DOCUMENTS

| TW | 362855 | 6/1999 |
|---|---|---|
| TW | M392207 | 11/2010 |

* cited by examiner

*Primary Examiner* — Joshua J Michener
*Assistant Examiner* — Chi Q Nguyen
(74) *Attorney, Agent, or Firm* — Muncy, Geissler, Olds & Lowe PC

(57) ABSTRACT

A cover structure for an outdoor casing includes a top cover and an inner cover-brow. A side wall is formed on the periphery of the top cover. The inner cover-brow has a first brow plate and a second brow plate. An inclined plate interconnects the first brow plate and the second brow plate. The inclined plate has a plurality of through holes. The second brow plate is connected to the side wall. The interior included angle of the first brow plate and the inclined plate is an acute angle. The cover structure not only helps the outdoor casing to ventilate and dissipate heat, but also enhances the outdoor casing's water repellency.

12 Claims, 6 Drawing Sheets

US 8,656,663 B2

COVER STRUCTURE FOR OUTDOOR CASING

BACKGROUND

1. Technical Field

The present invention generally relates to a casing structure, and more particularly, to a cover structure for an outdoor casing.

2. Related Art

The need to install large electronic apparatuses outdoors has been rising gradually in this information era. These electronic apparatuses must be put inside outdoor casings to avoid deterioration caused by the sunlight and the rain. Nowadays the most frequently seen outdoor casings are outdoor telecommunication casings. Outdoor telecommunication casings are used when the machine room of a telecommunication company and the users' equipment are too far apart. These casings can be connected to the machine room and the users' equipment through optical fiber, cable, or other communication lines. The electronic apparatuses in these casings can repeat or amplify the attenuated signal so as to ensure the user's communication quality.

As shown in FIG. 1 and FIG. 2, a conventional outdoor telecommunication casing 10 has a containing space 20 in its interior for communication equipment to be installed therein. A convex part 30 extends from the top periphery of the casing 10. The bottom periphery of the convex part 30 has some air vents 301 that are connected to the containing space 20. The casing 10 further has a fan 40 above the containing space 20. The fan 40 can guide external air into the containing space 20, causing the incoming air to absorb heat from the electronic apparatus inside the casing 10, and then bring the heat out through the air vents 301. This process can dissipate the heat accumulated in the casing 10, and stabilize the operation of the electronic apparatus inside the casing 10.

However, the outdoor telecommunication casing 10 is not good at repelling water. If there is a storm, the horizontal arrangement at the bottom rim of the convex part 30 will gather some rain. Strong wind will blow the accumulated water into the air vents 301 and then into the top of the casing 10. The water will flow into the containing space 20 through the fan 40 or other gaps. The water will make the containing space 20 moist, and even will cause the communication apparatus to malfunction. Even if the water enters the containing space 20 is not much, some components may still be damaged. If a lot of water enters the containing space 20, then the communication apparatus may be soaked in the water and breakdown as a whole.

BRIEF SUMMARY

An embodiment of the present invention provides a cover structure for an outdoor casing. With an inner cover-brow having an inclined plate that has a plurality of through holes, the outdoor casing can not only facilitate air circulation and heat dissipation, but also provide good water repellency.

An embodiment of the present invention provides a cover structure for an outdoor casing. The cover structure has a top cover and an inner cover-brow. A side wall is formed on the periphery of the top cover. The inner cover-brow has a first brow plate and a second brow plate. An inclined plate interconnects the first brow plate and the second brow plate. The inclined plate has a plurality of through holes. The second brow plate is connected to the side wall. The interior included angle between the first brow plate and the inclined plate is an acute angle.

An embodiment of the present invention provides a cover structure for an outdoor casing. The cover structure includes a top cover and an inner cover-brow. A side wall is formed on the periphery of the top cover. The inner cover-brow has a first brow plate and an inclined plate extending from an end of the first brow plate. The inclined plate has a plurality of through holes. The inclined plate is connected to the side wall. The interior included angle between the first brow plate and the inclined plate is an acute angle.

The embodiments of the present invention allow external air to be guided into the outdoor casing, take away the heat generated by the large electronic apparatus inside the outdoor casing, and exit through the through holes. As a result, the interior of the outdoor casing will not be too hot to cause the large electronic apparatus to malfunction. Furthermore, the embodiments adopt the concept of a common passageway for both wind and water, use the boundary layer flow to control the flow path, and achieve good water repellency. In addition, the cover structure has some other designs for improving the water repellency. These designs can prevent water drops from flowing in along the lower cover or being blown in along the ceiling. As a result, the cover structure has superior water repellency.

It is to be understood that both the foregoing general description and the following detailed description are exemplary and explanatory only and are not restrictive of the invention, as claimed.

DETAILED DESCRIPTION

Figure 1:
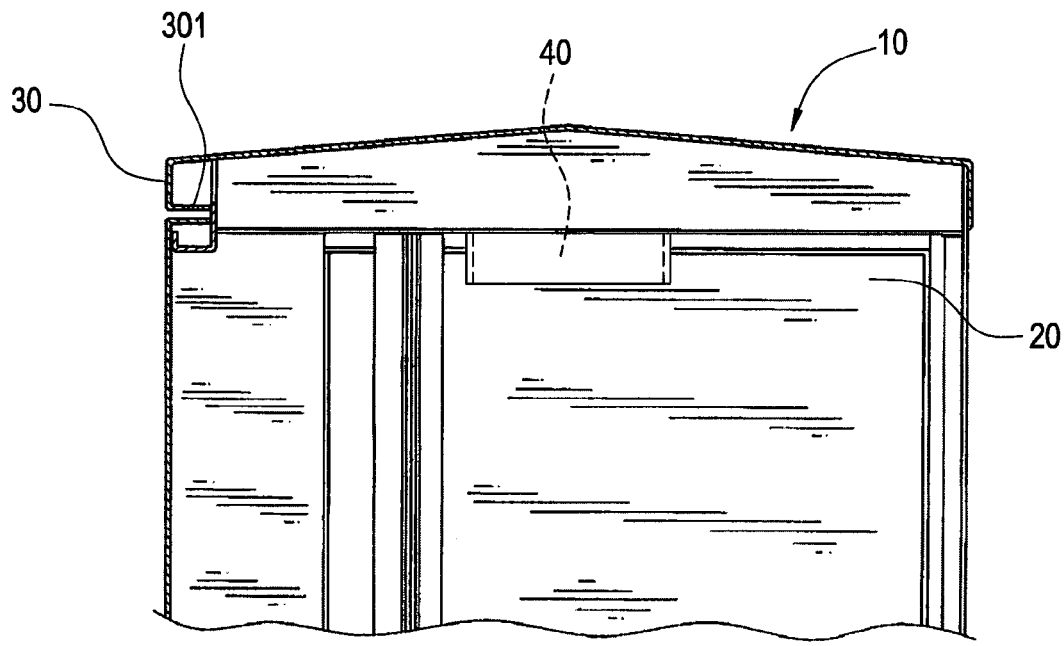
FIG. 1 illustrates a conventional outdoor telecommunication casing in a sectional view.
Figure 2:
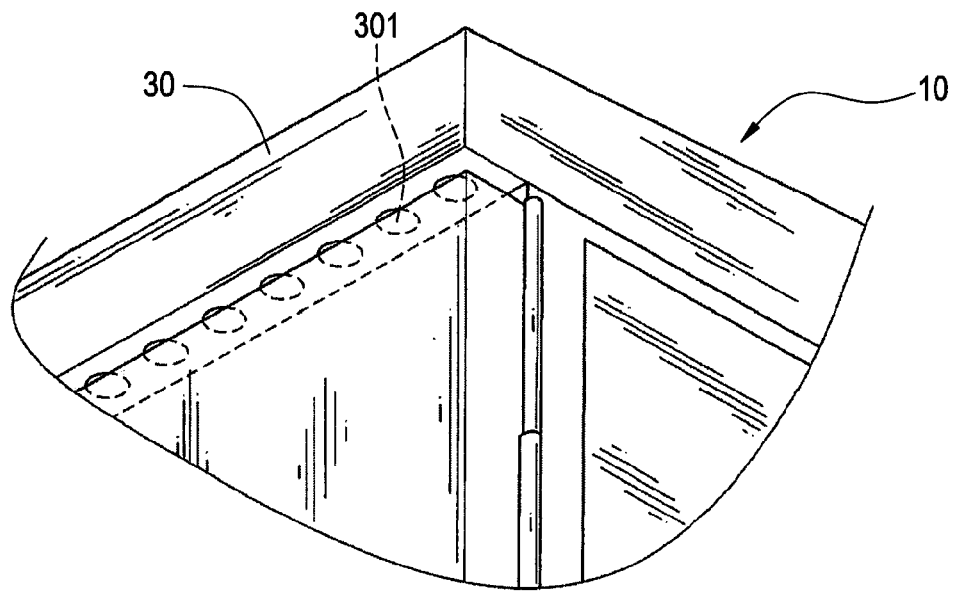
FIG. 2 illustrates the air vents of the conventional outdoor telecommunication casing.
Figure 3:
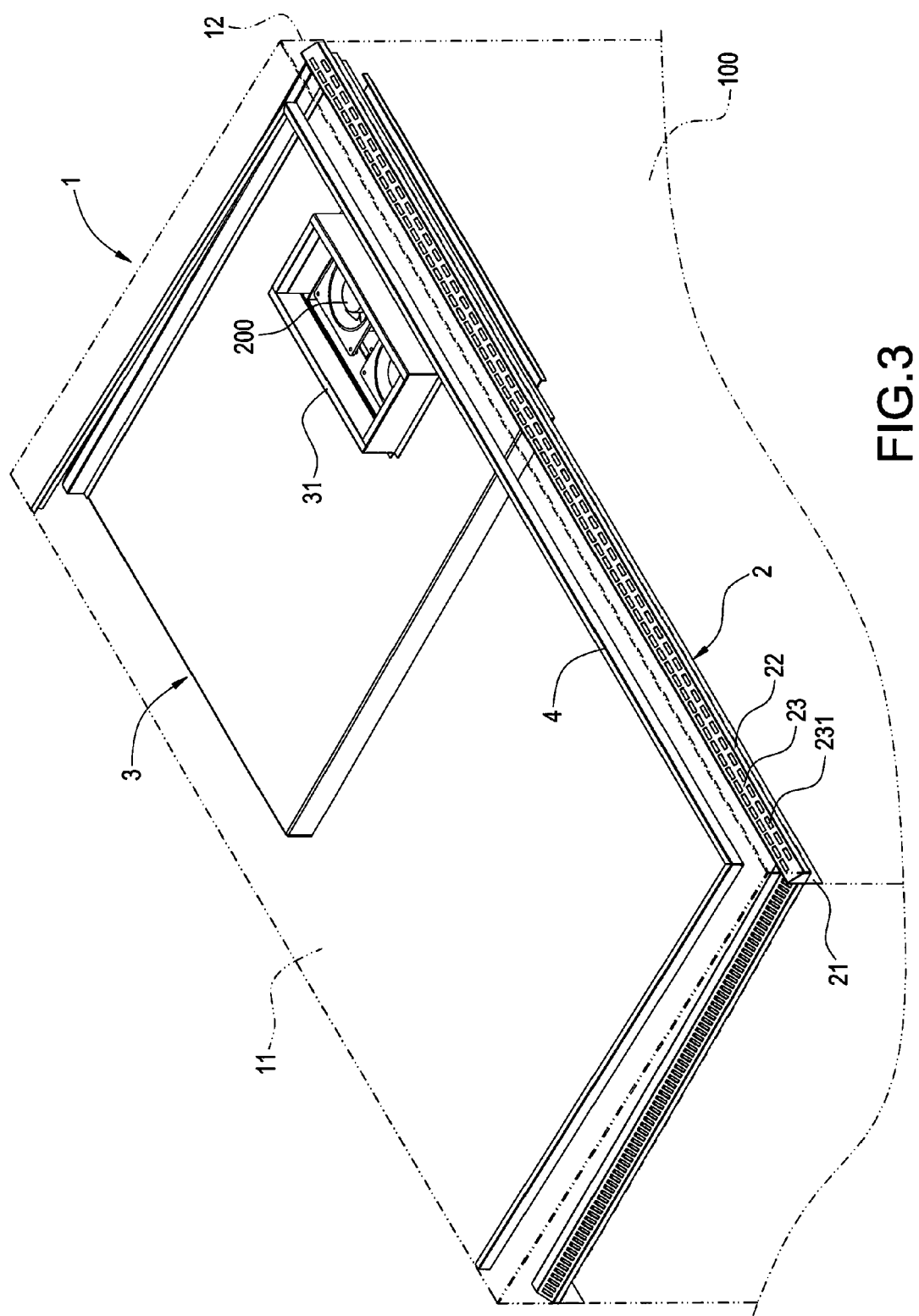
FIG. 3 illustrates a cover structure in combination according to an embodiment of the present invention.
Figure 4:
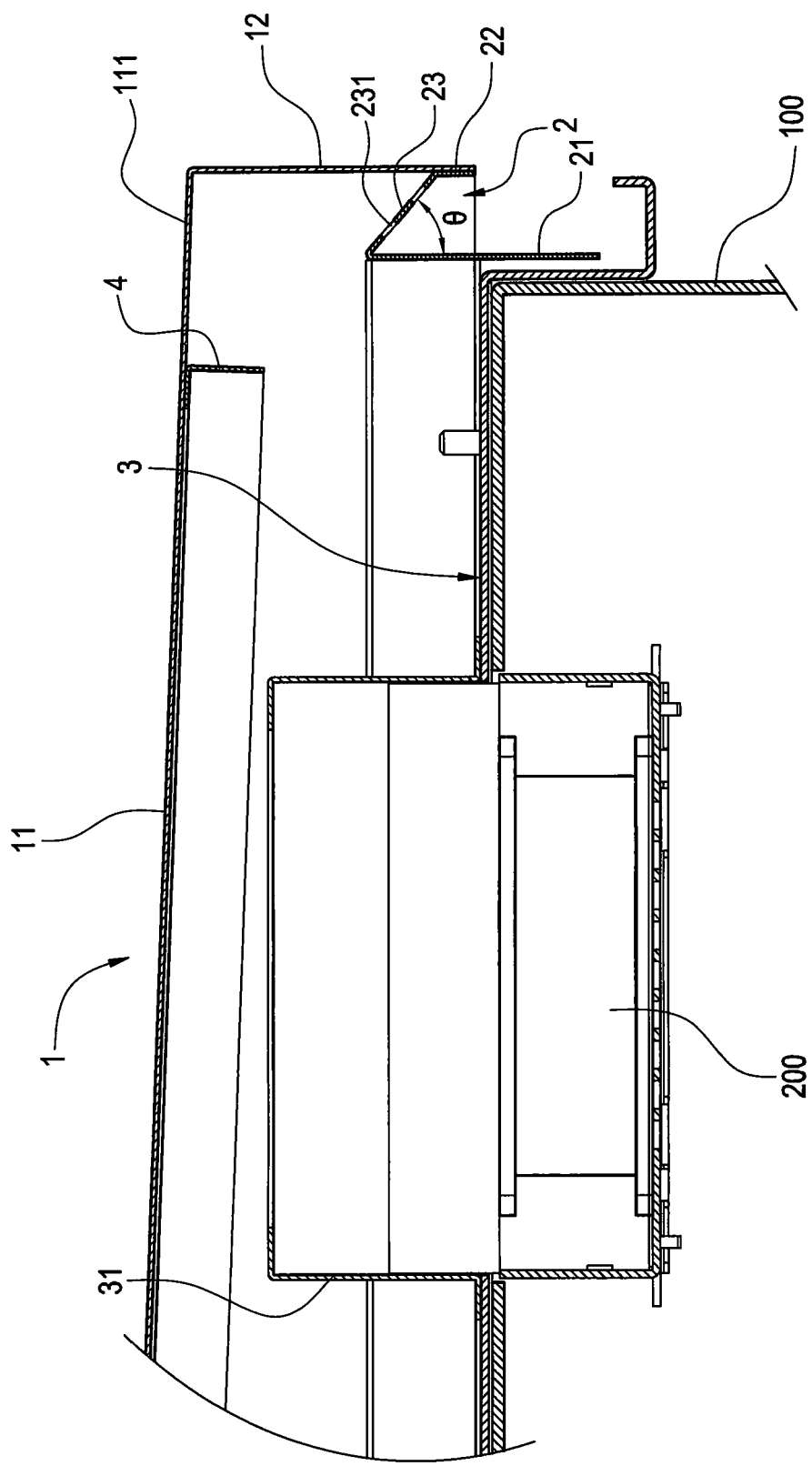
FIG. 4 illustrates the cover structure in a sectional view.

Please refer to FIG. 3 and FIG. 4, which illustrate a cover structure for an outdoor casing according to an embodiment of the present invention. In this embodiment, the cover structure is connected to the top of the outdoor casing 100, which is equipped with a wind-guiding fan 200. The cover structure mainly includes a top cover 1 and an inner cover-brow 2.

In this embodiment, the top cover 1 has a ceiling 11. The top cover 1 further has a side wall 12 extending downwards from the periphery of the ceiling 11. Viewing from the side wall 12, the ceiling 11 is an upward slope 111.

The inner cover-brow 2 has a first brow plate 21 and a second brow plate 22. An inclined plate 23 interconnects the first brow plate 21 and the second brow plate 22. The inclined plate 23 inclines downwards from the first brow plate 21 to the second brow plate 22. The inclined plate 23 has a plurality of through holes 231. The second brow plate 22 is connected to the side wall 12. The interior included angle between the first brow plate 21 and the inclined plate 23 is an acute angle θ.

The embodiment further includes a lower cover 3. The lower cover 3 and the top cover 1 are combined corresponding to each other. The lower cover 3 is connected to the top of the outdoor casing 100. The lower cover 3 has a hollow lid body 31 extending towards the top cover 1. The hollow lid body 31 correspondingly covers the wind-guiding fan 200.

The embodiment further includes a water barrier stripe 4. The water barrier stripe 4 is installed on the ceiling 11. The ceiling 11 forms a slope 111 from the side wall 12 to the water barrier stripe 4.

In the combination of the cover structure, the lower cover 3 is connected to the top of the outdoor casing 100. The lower cover 3 and the top cover 1 are combined corresponding to each other. The inner cover-brow 2 has the first brow plate 21 and the second brow plate 22. The second brow plate 22 is connected to the side wall 12. The inclined plate 23 is connected between the first brow plate 21 and the second brow plate 22. The inclined plate 23 has the plurality of through holes 231. Furthermore, the lower cover 3 has the hollow lid body 31 that extends towards the top cover 1 and correspondingly covers the wind-guiding fan 200. The ceiling 11 is installed with the water barrier stripe 4. The ceiling 11 forms the slope 111 between the side wall 12 and the water barrier stripe 4. In another embodiment, the first brow plate 21 and the side wall 12 are parallel; the acute angle θ between the first brow plate 21 and the inclined plate 23 is between 10 degrees and 80 degrees.

Figure 5:
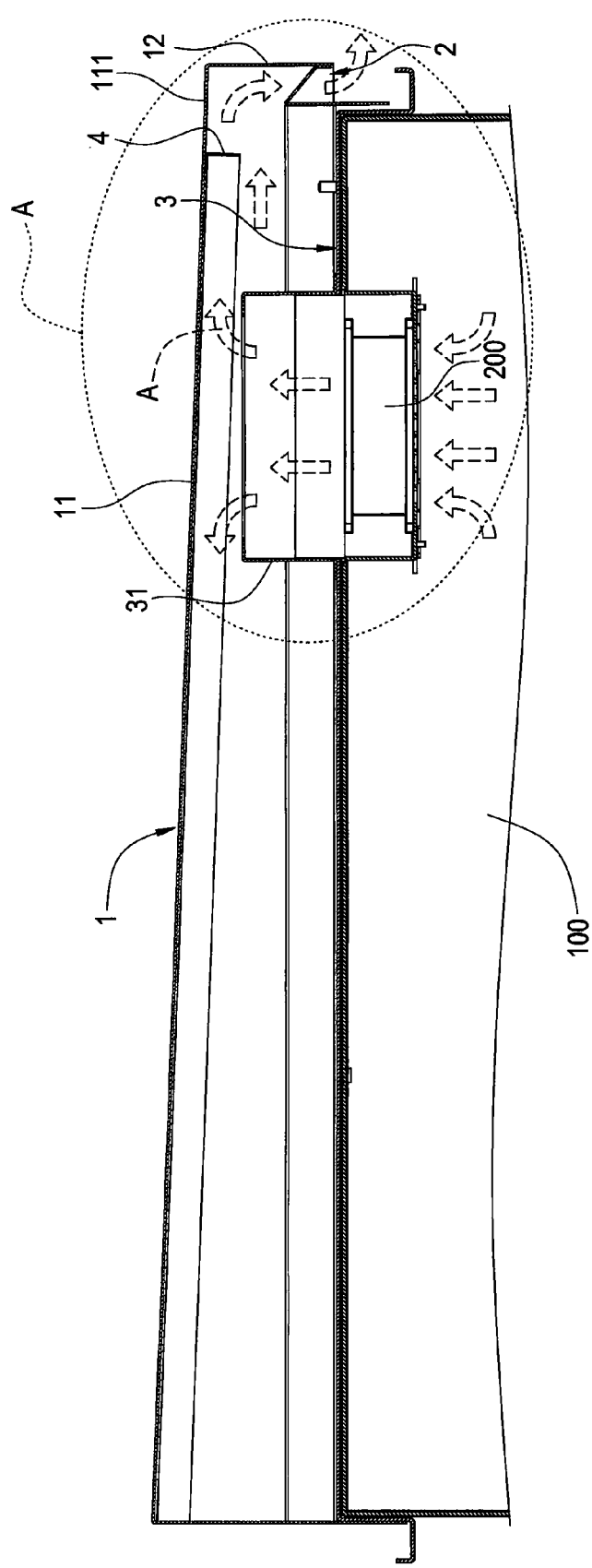
FIG. 5 illustrates the cover structure in use.

Please refer to FIG. 5, which illustrates the cover structure in use. The wind-guiding fan 200 guides the airflow A to the area between the top cover 1 and the lower cover 3, and guides external air into the outdoor casing 100. The incoming air takes away heat from the large electronic apparatus inside the outdoor casing 100, and brings the heat out via the through holes 231. This process dissipates heat away from the interior of the outdoor casing 100 and stabilizes the operation of the large electronic apparatus inside the outdoor casing 100.

Figure 6:
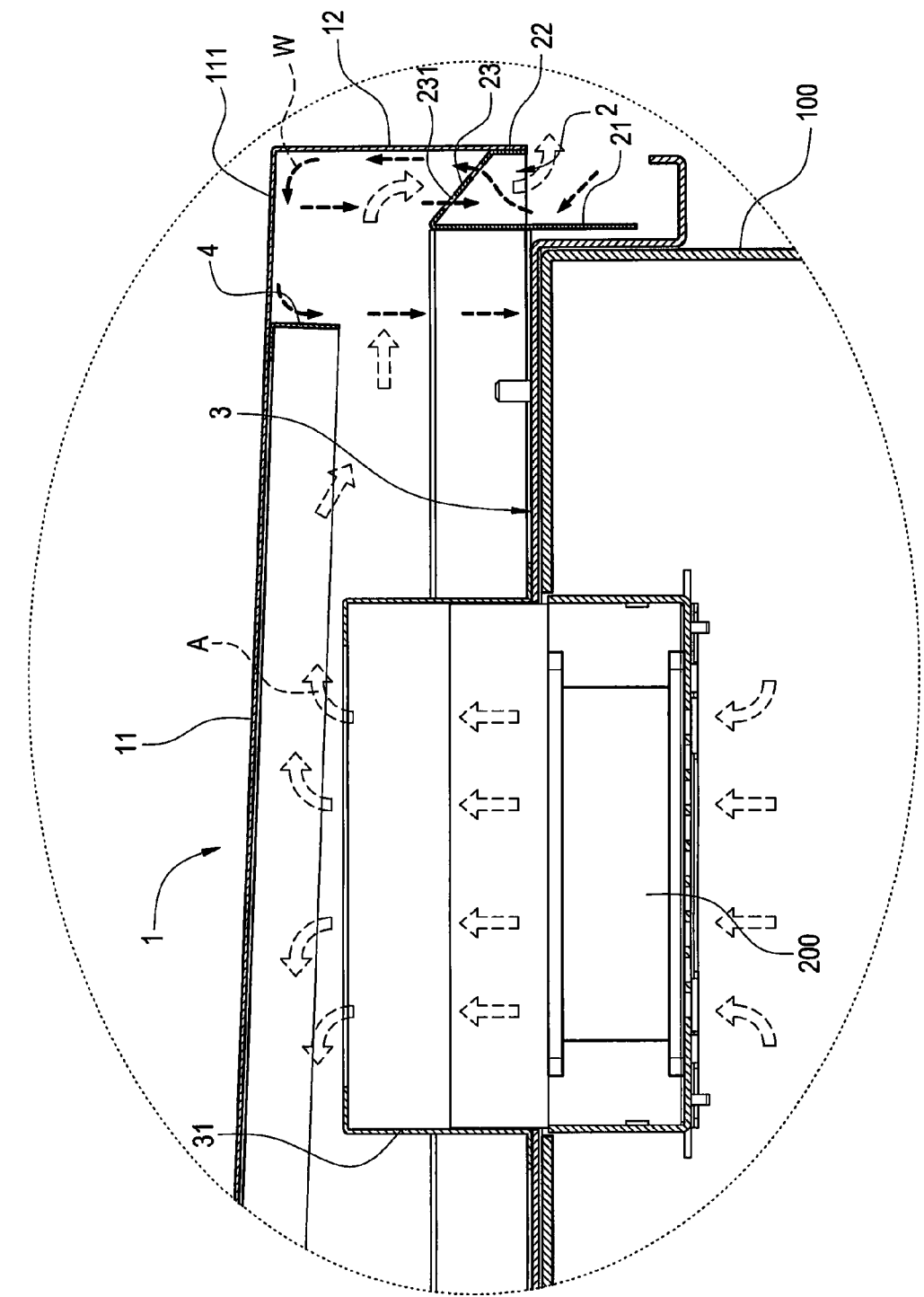
FIG. 6 illustrates another in-use status of the cover structure.

Please refer to FIG. 6, which illustrates another in-use status of the cover structure. The inclined plate 23 lies between the first brow plate 21 and the second brow plate 22. The interior included angle between the first brow plate 21 and the inclined plate 23 is an acute angle θ. When in bad weather, rain frequently will accumulate on the end of the second brow plate 22 but will not flow reversely towards the inclined plate 23. When rain drops come along with strong wind, the second brow plate 22 will block out the rain drops and prevent them from entering into the inclined plate 23. A part of the rain drops W that come along with wind can only splash into each of the through holes 231 along the direction of the first brow plate 21. At this moment, the water drops W that come along with wind will be blown into the top cover 1 along the side wall 12. Because air and the water drops W have different frictions against the slope 111 and the side wall 12, moisture will be dried down through draining. Although wind will enter the top cover 1, the water drops W will remain on the slope 111 and the side wall 12. Eventually, the water drops W will flow out from the through holes 231. The embodiment adopts the concept of a common passageway for both wind and water, uses the boundary layer flow to control the flow path, and achieves a good water repelling effect. As a result, the embodiment prevents the interior of the outdoor casing 100 from becoming moist, and hence prevents excessive moisture from negatively affecting the operation of the electronic apparatus inside the casing 100. The embodiment also prevents water drops from contacting and damaging some electronic components inside the outdoor casing 100. Furthermore, the embodiment prevents water from ponding in the outdoor casing 100 and destroying the large electronic apparatus as a whole.

The cover structure further has the following structure design. The lower cover 3 has the hollow lid body 31 that extends towards the top cover 1. The hollow lid body 31 correspondingly covers the wind-guiding fan 200. The ceiling 11 is installed with the water barrier stripe 4. The ceiling 11 forms the slope 111 from the side wall 12 to the water barrier stripe 4. In this structure design, the slope 111 can prevent the water drops W from flowing reversely and entering into the top cover 1. But if the wind is too strong, the water drops W that come with the wind can still be blown into the top cover 1 along the ceiling 11. If this happens, the water barrier stripe 4 will block the water drops W, causing them to drop onto the lower cover 3. Furthermore, because the opening of the hollow lid body 31 is higher than the lower cover 3, the water drops W will not enter the interior of the outdoor casing 100. The water drops W will accumulates on the lower cover 3 and flow out through the scuppers on the lower cover 3.

Figure 7:
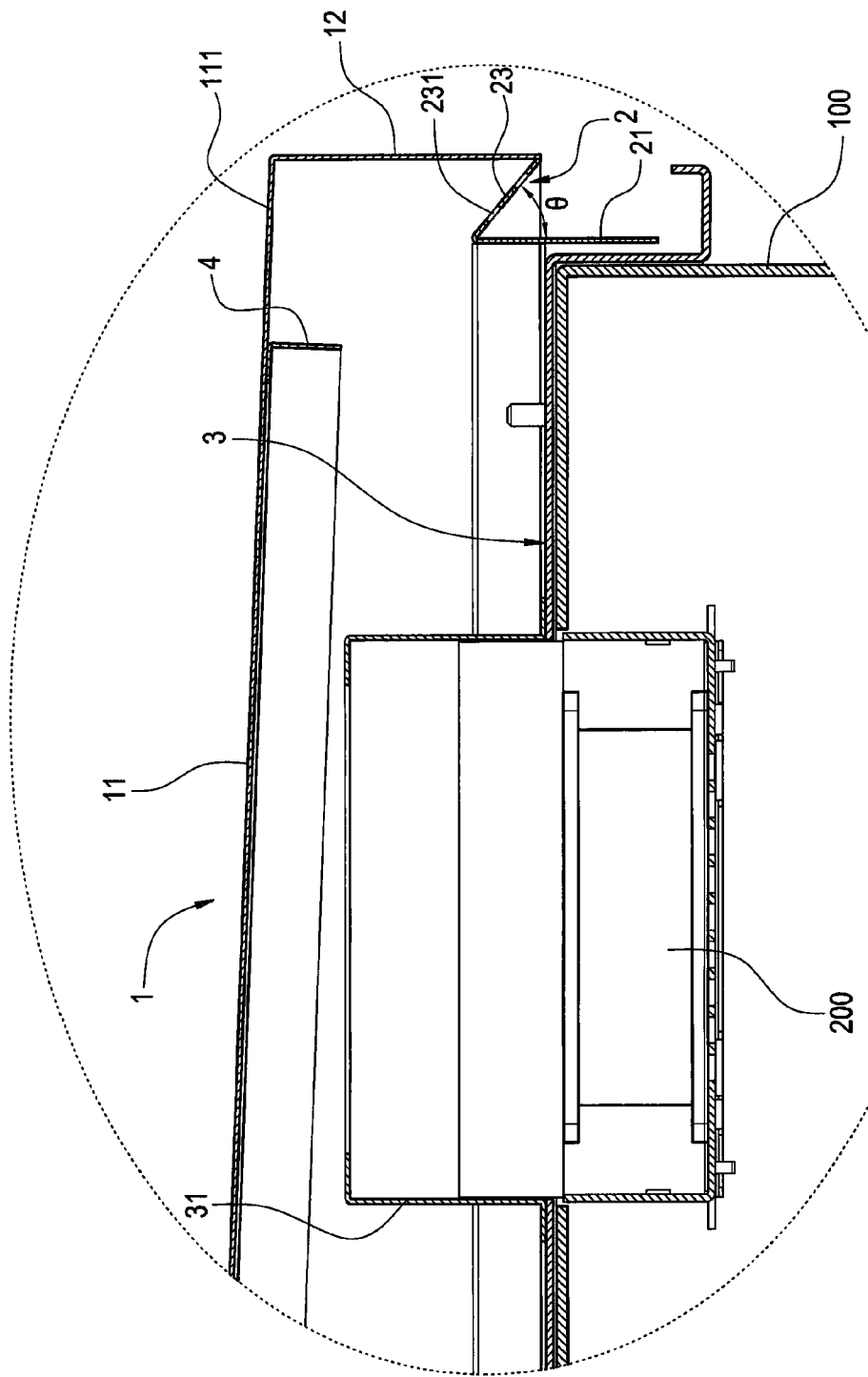
FIG. 7 illustrates a cover structure in a sectional view according to another embodiment of the present invention.

FIG. 7 shows another embodiment of the cover structure of the present invention. In this embodiment, the inner cover-brow 2 has a first brow plate 21 and an inclined plate 23 that extends downwards from an end of the first brow plate 21. The inclined plate 23 has a plurality of through holes 231. An end of the inclined plate 23 is connected to the side wall 12. The interior included angle between the first brow plate 21 and the inclined plate 23 is an acute angle θ. Because of this design, most of the rain drops that come with wind can only be splashed into each of the through holes 231 along the direction of the first brow plate 21. Because air and the rain drops have different frictions against the slope 111 and the side wall 12, moisture will be dried down through draining. Therefore, this design can effectively repel water and prevent the large electronic apparatus inside the outdoor casing 100 from malfunction or breakdown.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A cover structure for an outdoor casing, comprising:
   a top cover, a side wall being formed on the periphery of the top cover; and
   an inner cover-brow, the inner cover-brow being under the top cover and having a first brow plate and a second brow plate, the first brow plate being at the inner higher side of the inner cover-brow, the second brow plate being at the outer lower side of the inner cover-brow, the length of the first brow plate being longer than the length of the second brow plate in the vertical direction, an inclined plate interconnecting the first brow plate and the second brow plate, the inclined plate having a plurality of through holes, the second brow plate being connected to the side wall, an interior included angle between the first brow plate and the inclined plate being an acute angle,
   wherein the inclined plate is a flat plate with straight cross section and all the through holes are arranged on the inclined plate with the acute angle, the inclining direction of the inclined plate being from the inner higher side of the inner cover-brow to the outer lower side of the inner cover-brow.

2. The structure of claim 1, wherein the first brow plate and the side wall are parallel.

3. The structure of claim 1, wherein the acute angle is between 10 degrees and 80 degrees.

4. The structure of claim 1, wherein the top cover further comprises a ceiling that is connected to the side wall, and the ceiling is a slope.

5. The structure of claim 1, further comprising a lower cover, the lower cover and the top cover being combined corresponding to each other, the lower cover having a hollow lid body that extends towards the top cover.

6. The structure of claim 1, further comprising a water barrier stripe, the top cover further comprising a ceiling that is connected to the side wall, the water barrier stripe being installed on the ceiling.

7. A cover structure for an outdoor casing, comprising:

a top cover, a side wall being formed on the periphery of the top cover; and an inner cover-brow, the inner cover-brow being under the top cover and having a brow plate at the inner higher side of the inner cover-brow, and an inclined plate extending outwardly from an end of the brow plate, the inclined plate having a plurality of through holes, the inclined plate being connected to the side wall, an interior included angle between the brow plate and the inclined plate being an acute angle, wherein the inclined plate is a flat plate with straight cross section and all the through holes are arranged on the inclined plate with the acute angle, the inclining direction of the the inner cover-brow.

8. The structure of claim 7, wherein the brow plate and the side wall are parallel.

9. The structure of claim 7, wherein the acute angle is between 10 degrees and 80 degrees.

10. The structure of claim 7, wherein the top cover further comprises a ceiling that is connected to the side wall, and the ceiling is a slope.

11. The structure of claim 7, further comprising a lower cover, the lower cover and the top cover being combined corresponding to each other, the lower cover having a hollow lid body that extends towards the top cover.

12. The structure of claim 7, further comprising a water barrier stripe, the top cover further comprising a ceiling that is connected to the side wall, the water barrier stripe being installed on the ceiling.

\* \* \* \* \*